(12) United States Patent
Huang et al.

(10) Patent No.: US 7,566,932 B2
(45) Date of Patent: Jul. 28, 2009

(54) STATIC RANDOM ACCESS MEMORY UNIT

(75) Inventors: Jun-Chi Huang, Taichung County (TW); Chia-Wen Liang, Hsinchu (TW); Yung-Chang Lin, Taichung Hsien (TW); Richard Lee, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 450 days.

(21) Appl. No.: 11/308,368

(22) Filed: Mar. 20, 2006

(65) Prior Publication Data
US 2007/0215937 A1  Sep. 20, 2007

(51) Int. Cl.
*H01L 29/94* (2006.01)
(52) U.S. Cl. ............................... 257/330; 257/334
(58) Field of Classification Search ............ 257/330, 257/334
See application file for complete search history.

(56) References Cited

U.S. PATENT DOCUMENTS

2005/0184326 A1  8/2005  Cheng

*Primary Examiner*—Douglas M Menz
(74) *Attorney, Agent, or Firm*—Jianq Chyun IP Office

(57) ABSTRACT

A static random access memory (SRAM) unit comprising a substrate, a gate dielectric layer, a gate, a trench capacitor, a pair of source/drain regions, a first contact and a second contact is provided. The substrate has a trench formed therein. The gate dielectric layer is disposed on the substrate and the gate is disposed on the gate dielectric layer. The trench capacitor is disposed in the trench near one side of the gate. The source/drain regions are disposed in the substrate near the respective sides of the gate with one of the source/drain region positioned between the gate and the trench capacitor. The first contact is electrically connected to the trench capacitor and the second contact is electrically connected to the other source/drain region.

8 Claims, 4 Drawing Sheets

STATIC RANDOM ACCESS MEMORY UNIT

BACKGROUND OF THE INVENTION

1. Field of the Invention

The present invention relates to a static random access memory unit. More particularly, the present invention relates to a single transistor static random access memory unit.

2. Description of the Related Art

With the fabrication of semiconductor devices having deep sub-micron dimension, the size of each device is also reduced even further. Consequently, the size of each memory cells in a memory device has become smaller and smaller. On the other hand, as the quantity of data that needs to be stored and processed inside our information electronic products (such as computers, mobile phones, digital cameras or personal digital assistant) continues to increase, the information electronic products demand memories with ever-increasing storage capacity. With such conflicting demands for a larger storage capacity but a shrinking size in the memory, methods capable of producing a smaller memory device, a higher integration level for the device and yet maintaining a certain high quality level is a major target for the industry.

Random access memory (RAM) is a versatile volatile memory widely used in many types of information electronic products. In general, RAM can be categorized as a static random access memory (SRAM) and dynamic random access memory (DRAM).

SRAM stores digital signals through the conductive state of the transistor inside a memory cells. According to the design method, each conventional SRAM memory cell is built using four transistors and two resistors (4T and 2R) or using six transistors (6T). On the other hand, DRAM stores digital signals through the charging state of the capacitor inside a memory cell. According to the design method, each conventional DRAM memory cell is built using a single transistor and a single capacitor (including a stacked capacitor or a deep-trench capacitor).

SRAM has a fast data processing speed and its production can be integrated with complementary metal oxide semiconductor (CMOS). Therefore, SRAM is simpler to fabricate. However, each memory cell in SRAM occupies a relatively large area (for the existing technology, area occupation of an SRAM memory cell having six transistors is roughly 10 to 16 times that of a DRAM memory cell) and hence provides very little leeway for significantly increasing the level of integration. On the other hand, although DRAM memory cells tend to occupy considerably less area than SRAM memory cells, the need for fabricating capacitors in a DRAM cell renders its fabrication more complicated and expensive.

In recent years, the industry has proposed a single transistor static random access memory (1T-SRAM or pseudo-SRAM). In the 1T-SRAM, a DRAM memory cell (1T1C) replaces the SRAM memory cell (6T or 4T2R) while the original peripheral circuit structure of the SRAM is still maintained. Hence, each memory cell can have a smaller dimension resulting in a higher level of integration and a lower random access cycling time. Moreover, there is no need to perform refreshing operations similar to a conventional SRAM. Thus, 1T-SRAM is an ideal candidate for replacing the conventional SRAM and DRAM.

Nevertheless, the memory units inside the memory cell array of a 1T-SRAM as currently developed by the industry is not optimally disposed. As a result, a lower level of integration is obtained.

SUMMARY OF THE INVENTION

Accordingly, at least one objective of the present invention is to provide a static random access memory (SRAM) unit capable of increasing the level of integration of the memory devices.

At least a second objective of the present invention is to provide a static random access memory (SRAM) unit having a better disposition of internal devices.

At least a third objective of the present invention is to provide a static random access memory (SRAM) unit that can effectively reduce the area of occupation of each memory device.

To achieve these and other advantages and in accordance with the purpose of the invention, as embodied and broadly described herein, the invention provides a static random access memory (SRAM) unit. The SRAM unit comprises a substrate, a gate dielectric layer, a gate, a trench capacitor, a pair of source/drain regions, a first contact and a second contact. The substrate has a trench formed therein. The gate dielectric layer is disposed on the substrate and the gate is disposed on the gate dielectric layer. The trench capacitor is disposed in the substrate on one side of the gate. The source/drain regions are disposed in the substrate on the respective sides of the gate. One of the source/drain regions is on one side of the gate between the gate and the trench capacitor. The first contact is electrically connected to the trench capacitor and the second contact is electrically connected to another source/drain region.

According to one preferred embodiment of the present invention, the aforementioned SRAM unit further comprises a passing gate disposed above the trench capacitor.

According to one preferred embodiment of the present invention, the trench capacitor in the aforementioned SRAM unit further comprises a lower electrode, a capacitor dielectric layer, an upper electrode and an isolation structure. The lower electrode is disposed in the substrate on the surface of the trench and the capacitor dielectric layer is disposed on the surface of the trench. The upper electrode is disposed in the trench and above the substrate to cover the capacitor dielectric layer. The isolation structure is disposed in part of the capacitor dielectric layer and the upper electrode and in part of the substrate.

According to one preferred embodiment of the present invention, the capacitor dielectric layer of the aforementioned SRAM unit is also disposed on part of the substrate on the upper side margin of the trench.

According to one preferred embodiment of the present invention, the capacitor dielectric layer in the aforementioned SRAM unit is an oxide/nitride/oxide composite stack layer.

According to one preferred embodiment of the present invention, the upper electrode in the aforementioned SRAM unit is fabricated using doped polysilicon.

According to one preferred embodiment of the present invention, the lower electrode of the aforementioned DRAM unit comprises an inversion layer.

According to one preferred embodiment of the present invention, the isolation structure in the aforementioned SRAM unit comprises a shallow trench isolation (STI) structure.

According to one preferred embodiment of the present invention, the first contact comprises an upper electrode contact and the second contact comprises a bit-line contact.

The present invention also provides an alternative static random access memory (SRAM) unit. The SRAM unit comprises a substrate, a gate dielectric layer, a pair of trench capacitors, a pair of gates, two pairs of source/drain regions, a pair of first contacts and a pair of second contacts. The substrate has two trenches formed therein. The gate dielectric layer is disposed on the substrate and the gates are disposed on the gate dielectric layer. The trench capacitors are positioned between the gates and disposed inside the respective trenches. The source/drain regions are disposed in the substrate on the respective sides of the gates. The source/drain region on one side of the gates is positioned between the gate and the trench capacitor. The first contacts are electrically connected to the respective trench capacitors and the second contacts are electrically connected to the respective source/drain region on another side of the gates.

The present invention also provides yet another static random access memory (SRAM) unit suitable for forming a memory array. The memory array comprises at least a first memory cell array and a second memory cell array formed adjacent to each other. The memory array comprises a substrate, a first trench capacitor, a second trench capacitor, a third trench capacitor, a fourth trench capacitor, a gate dielectric layer, a first conductive line, a second conductive line, a third conductive line, a fourth conductive line, a plurality of source/drain regions, a plurality of first contacts and a plurality of second contacts. The substrate has four trenches formed therein. Two of the trenches are disposed in the first memory cell array while the other two trenches are disposed in the second memory cell array. The first trench capacitor and the fourth trench capacitor are disposed in the trenches of the second memory cell array. The second trench capacitor and the third trench capacitor are disposed in the trenches of the first memory cell array. The gate dielectric layer is disposed on the substrate. The first conductive line, the second conductive line, the third conductive line and the fourth conductive line are sequentially disposed on the gate dielectric layer in a direction perpendicular to the direction of extension of the first memory cell array and the second memory cell array. The first conductive line is disposed on the other side of the side where the second trench capacitor is adjacent to the third trench capacitor and passes right above the second trench capacitor. The second conductive line and the third conductive line are disposed between the first trench capacitor and the fourth trench capacitor such that the second conductive line passes over the second trench capacitor and the third conductive line passes over the third trench capacitor. The source/drain regions are disposed in the substrate on the respective sides of the first conductive line and the fourth conductive line of the first memory cell array as well as in the substrate on the respective sides of the second conductive line and the third conductive line of the second memory cell array. The first contacts are electrically connected to the respective trench capacitors. The second contacts are electrically connected to the respective source/drain regions. This includes the source/drain region on the opposite side of the side where the first conductive line is adjacent to the second trench capacitor, the source/drain region on the opposite side of the side where the fourth conductive line is adjacent to the third trench capacitor and the source/drain region in the area between the second conductive line and the third conductive line.

According to one preferred embodiment of the present invention, that portion of the first conductive line, the second conductive line, the third conductive line and the fourth conductive line in the aforementioned SRAM unit lying within the first memory cell array are a first gate, a second passing gate, a third passing gate and a fourth gate respectively and that portion of the first conductive line, the second conductive line, the third conductive line and the fourth conductive line lying within the second memory cell array are a first passing gate, a second gate, a third gate and a fourth passing gate respectively.

According to one preferred embodiment of the present invention, the first passing gate, the second passing gate, the third passing gate and the fourth passing gate in the aforementioned SRAM unit are disposed over the first trench capacitor, the second trench capacitor, the third trench capacitor and the fourth trench capacitor respectively.

According to one preferred embodiment of the present invention, the first conductive line, the second conductive line, the third conductive line and the fourth conductive line comprise word lines.

Accordingly, because a better disposition of the SRAM unit in the present invention, area occupation of the memory devices is reduced and hence a higher level of integration of the memory devices is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
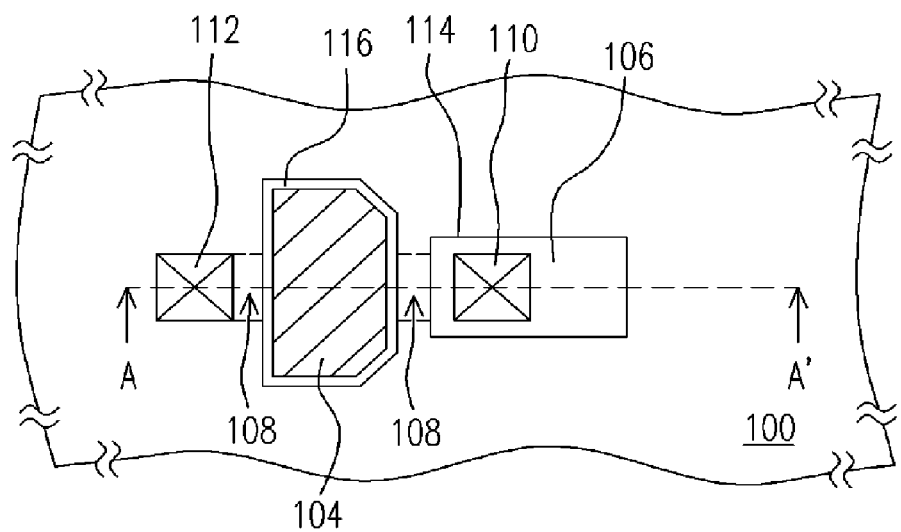
FIG. 1 is a top view of a static random access memory (SRAM) unit according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
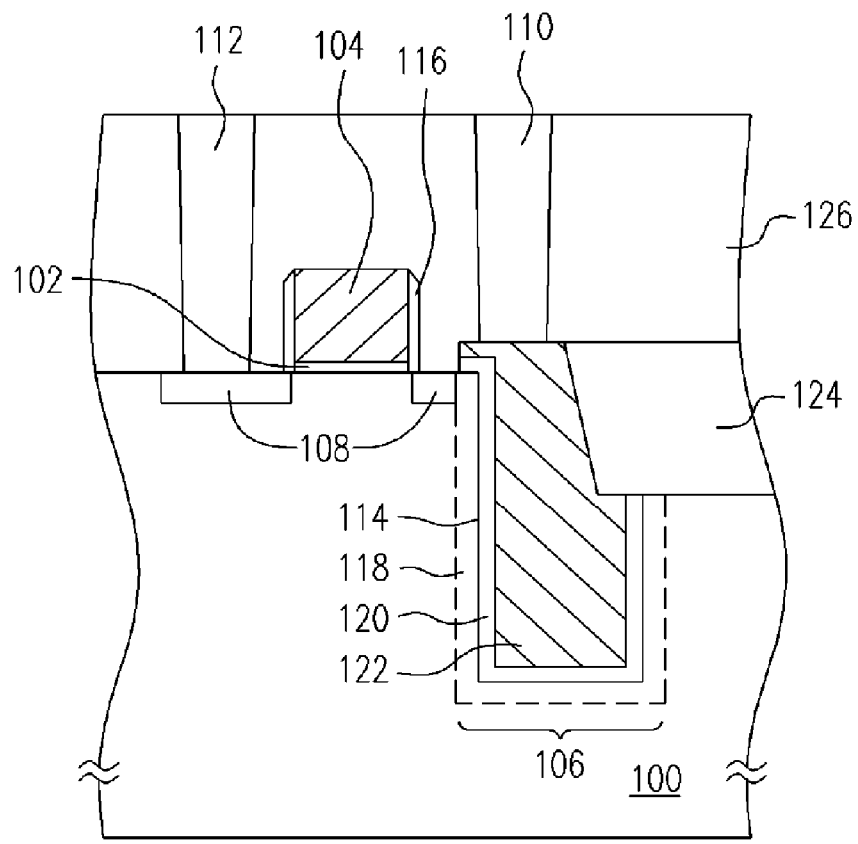
FIG. 2 is a cross-sectional view along line A-A' in FIG. 1.

FIG. 1 is a top view of a static random access memory (SRAM) unit according to a first embodiment of the present invention. FIG. 2 is a cross-sectional view along line A-A' in FIG. 1. As shown in FIGS. 1 and 2, a static random access memory unit comprising a substrate 100, a gate dielectric layer 102, a gate 104, a trench capacitor 106, a pair of source/drain regions 108, a first contact 110, a second contact 112 and a dielectric layer 126. The substrate 100 has a trench 114 formed therein. The gate dielectric layer 102 is disposed on the substrate 100. The gate dielectric layer 102 is fabricated using silicon oxide layer and formed by performing a thermal oxidation process, for example.

The gate 104 is disposed on the gate dielectric layer 102. The gate 104 is fabricated using doped polysilicon and formed by performing a chemical vapor deposition process with in-situ doping, for example. In addition, a spacer 116 may also be disposed on the respective sides of the gate 104. The spacers 116 are fabricated using silicon nitride, for example.

The trench capacitor 106 is disposed in the trench 114 on one side of the gate 104. The trench capacitor 106 comprises a lower electrode 118, a capacitor dielectric layer 120, an upper electrode 122 and an isolation structure 124. The lower electrode 118 is disposed in the substrate 100 on the surface of the trench 114. The lower electrode 118 is an inversion layer, for example. The inversion layer is formed in the substrate 100 on the surface of the trench 114, for example, by subsequently applying a voltage to a contact 110 having electrical connection with the trench capacitor 106. The capacitor dielectric layer 120 is disposed on the surface of the trench 114 in a location over part of the substrate 100 on the upper side margin of the trench 114. The capacitor dielectric layer 120 is fabricated using a dielectric material with a high dielectric constant, for example. An example of a high dielectric constant dielectric material layer includes an oxide/nitride/oxide composite stack layer. Furthermore, the upper electrode 122 is disposed in the trench 114 over the substrate 100 to cover the capacitor dielectric layer 120. The upper electrode 122 is fabricated using doped polysilicon, for example. The isolation structure 124 is disposed in part of the capacitor dielectric layer 120 and the upper electrode 122 and in part of the substrate 100. The isolation structure 124 is a shallow trench isolation (STI), for example.

The source/drain regions 108 are disposed in the substrate 100 on the respective sides of the gate 104. The source/drain region 108 on one side of the gate 104 is located between the gate 104 and the trench capacitor 106 and electrically connected to the lower electrode 118 of the trench capacitor 106. The other source/drain region 108 is shared between two adjacent gates 104. The aforementioned source/drain regions 108 are formed by performing an ion implant process, for example.

The dielectric layer 126 is disposed over the substrate 100 to cover the gate 104 and the trench capacitor 106. The dielectric layer 126 is a silicon oxide layer formed, by performing a chemical vapor deposition process, for example.

The contact 110 is disposed in the dielectric layer 126 and electrically connected to the trench capacitor 106. The aforementioned inversion layer serving as the lower electrode 118 of the trench capacitor 106 is formed in the substrate 100 on the surface of the trench 114 when a voltage is applied to the contact 110. The contact 110 is an upper electrode contact, for example. The contact 110 is fabricated using doped polysilicon, aluminum, tungsten or copper, for example.

The contact 112 is also disposed in the dielectric layer 126 and electrically connected to the source/drain region 108 on the other side of the gate 104. The contact 112 is a bit-line contact, for example. The contact 112 is fabricated using doped polysilicon, aluminum, tungsten or copper, for example.

Figure 3:
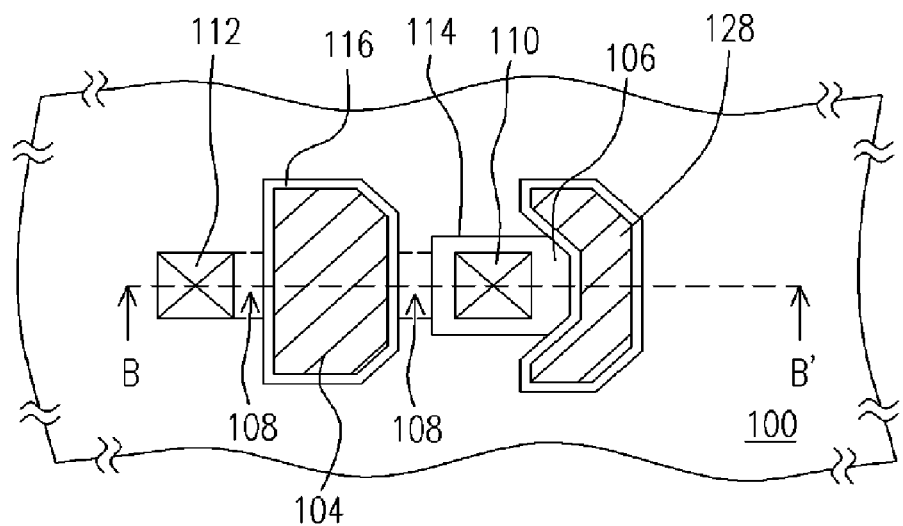
FIG. 3 is a top view of a static random access memory (SRAM) unit according to a second embodiment of the present invention.
Figure 4:
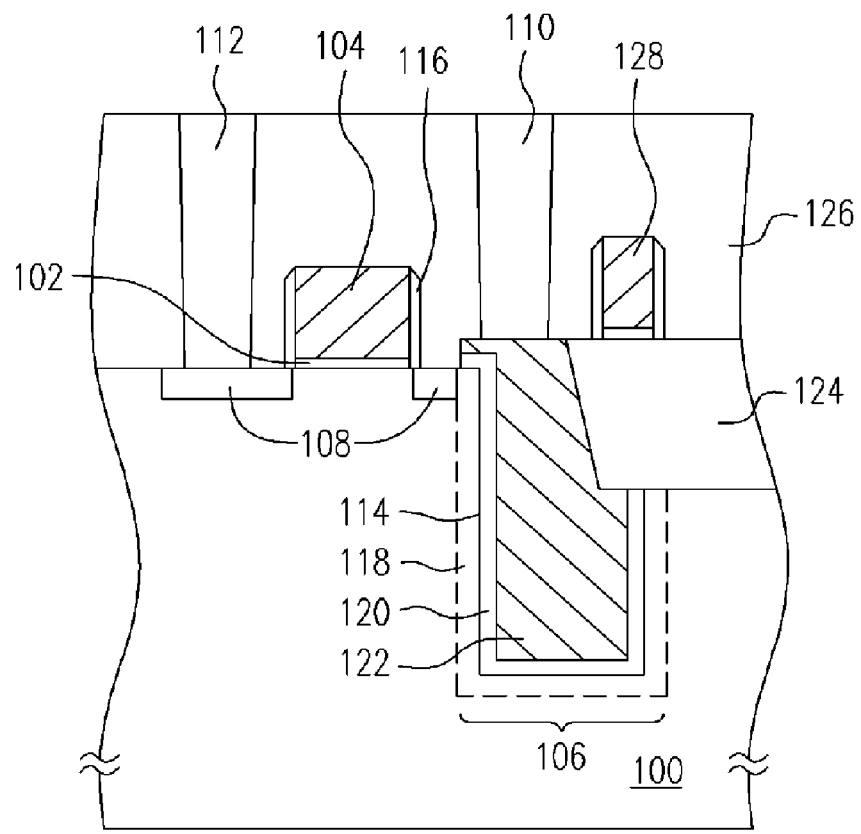
FIG. 4 is a cross-sectional view along line B-B' in FIG. 3.

FIG. 3 is a top view of a static random access memory (SRAM) unit according to a second embodiment of the present invention. FIG. 4 is a cross-sectional view along line B-B' in FIG. 3. In the second embodiment of the present invention, the SRAM unit further includes a passing gate 128 disposed on the trench capacitor 106. Since other components in the second embodiment are identical to the ones in the first embodiment, a detailed description is omitted.

As shown in the first and the second embodiment, the SRAM unit is a single bit memory unit. Therefore, using this SRAM unit as the smallest repeating unit, a memory device with a high level of integration can be produced.

Figure 5:
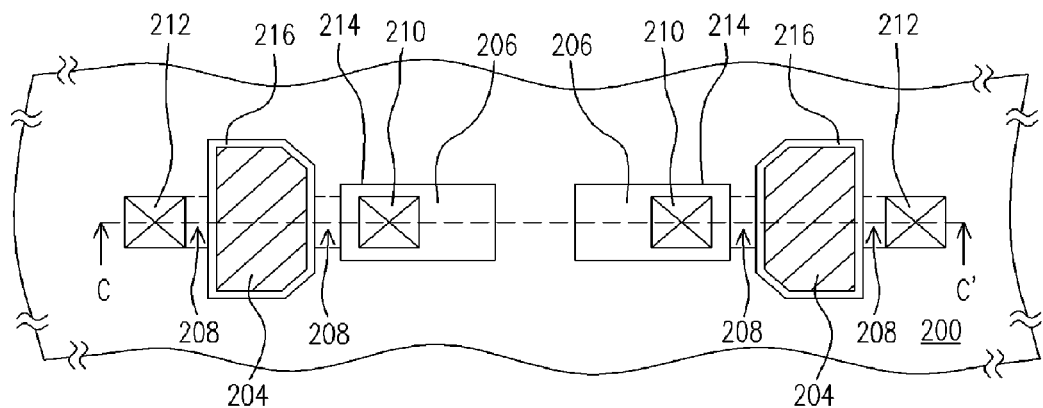
FIG. 5 is a top view of a static random access memory (SRAM) unit according to a third embodiment of the present invention.
Figure 6:
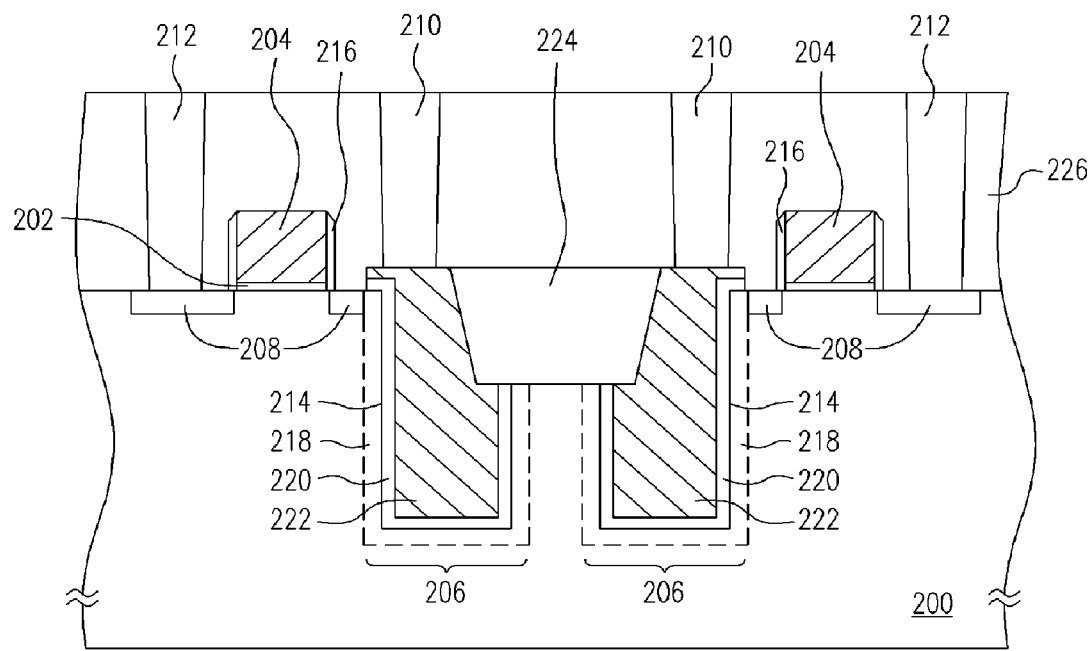
FIG. 6 is a cross-sectional view along line C-C' in FIG. 5.

FIG. 5 is a top view of a static random access memory (SRAM) unit according to a third embodiment of the present invention. FIG. 6 is a cross-sectional view along line C-C' in FIG. 5. As shown in FIGS. 5 and 6, the static random access memory unit in the present invention comprises a substrate 200, a gate dielectric layer 202, a pair of gates 204, a pair of trench capacitors 206, two pairs of source/drain regions 208, a pair of first contacts 210, a pair of second contacts 212 and a dielectric layer 226. The substrate 200 has a pair of trenches 214 formed therein. The gate dielectric layer 202 is disposed on the substrate 200. The gate dielectric layer 202 is fabricated using silicon oxide and is formed by performing a thermal oxidation process, for example.

The gate 204 is disposed on the gate dielectric layer 202. The gate 204 is a doped polysilicon layer formed, for example, by performing a chemical vapor deposition process with in-situ doping. In addition, a spacer 216 may be formed on the respective sides of the gate 204. The spacers 216 are formed using silicon nitride, for example.

The trench capacitors 206 are disposed in the respective trenches 214 between the two gates 204. Each trench capacitor 206 comprises a lower electrode 218, a capacitor dielectric layer 220, an upper electrode 222 and an isolation structure 224. The lower electrode 218 is disposed in the substrate 200 on the surface of the trench 214. The lower electrode 218 is an inversion layer, for example. The method of forming the inversion layer in the substrate 200 on the surface of the trench 214 includes, for example, applying a voltage to a contact 210 electrically connected to the trench capacitor 206 in subsequent operation. Furthermore, the capacitor dielectric layer 220 is disposed on the surface of the trench 214 and on part of the substrate 200 on the upper side margin of the trench 214. The capacitor dielectric layer 220 is fabricated using a high dielectric constant dielectric material. The high dielectric constant dielectric material layer is an oxide/nitride/oxide composite stack layer, for example. In addition, the upper electrode 222 is disposed in the trench 214 on the substrate 200 to cover the capacitor dielectric layer 220. The upper electrode 222 is fabricated using doped polysilicon, for example. The isolation structure 224 is disposed on part of the capacitor dielectric layer 220 and the upper electrode 222 and in part of the substrate 200. The isolation structure 224 is a shallow trench isolation (STI) structure, for example.

The source/drain regions 208 are disposed in the substrate 200 on the respective sides of the gates 204. The source/drain region 208 on one side of each gate 204 is disposed between the gate 204 and the trench capacitor 206 and is electrically connected to the lower electrode 218 of the trench capacitor 206. The source/drain region 208 on another side is shared between two adjacent gates 204. The aforementioned source/drain regions 208 are formed, for example, by performing an ion implant process.

The dielectric layer 226 is disposed on the substrate 200 to cover the gates 204 and the trench capacitors 206. The dielectric layer 226 is fabricated using silicon oxide and formed by performing a chemical vapor deposition process, for example.

The contacts 210 are disposed in the dielectric layer 226 and electrically connected to the trench capacitors 206. By applying a voltage to the contact 210, an inversion layer serving as the lower electrode 218 of the trench capacitor 206 is formed in the substrate 200 on the surface of the trench 214. The contacts 210 are upper electrode contacts, for example. The contacts 210 are fabricated using doped polysilicon, aluminum, tungsten or copper, for example.

The contacts 212 are disposed in the dielectric layer 226 and electrically connected to the source/drain regions 208 on the other side of the respective gates 204. The contacts 212 are bit-line contacts, for example. The contacts 212 are fabricated using doped polysilicon, aluminum, tungsten or copper, for example.

As shown in the third embodiment, the SRAM unit is a two bit memory unit. Therefore, a memory device having such a SRAM unit structure not only improves its disposition, but also reduces the area occupation of the memory device.

Figure 7:
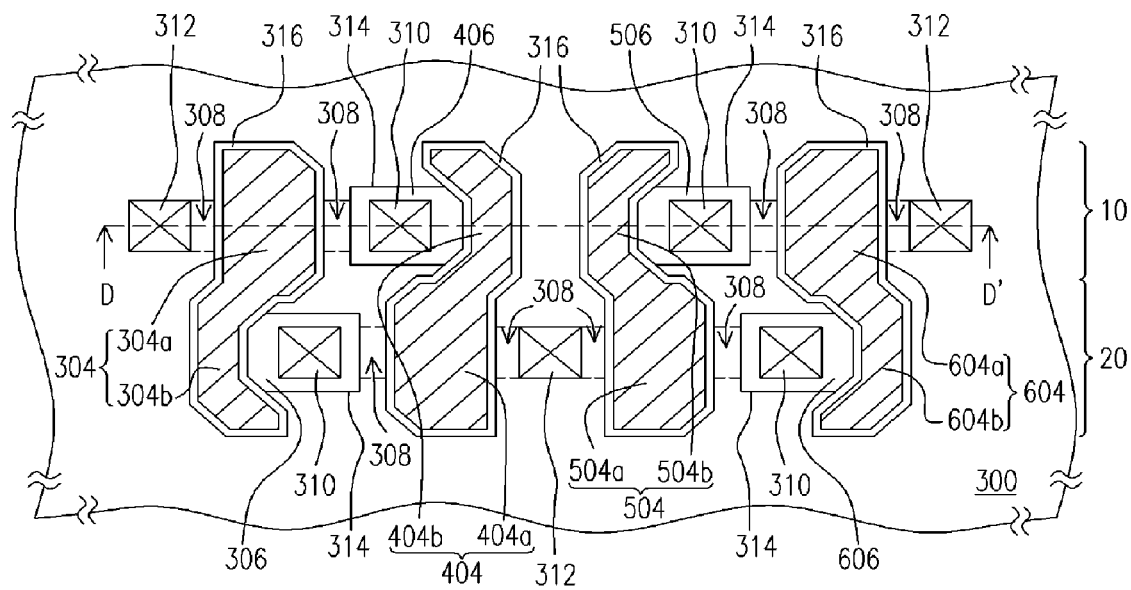
FIG. 7 is a top view of a static random access memory (SRAM) unit according to a fourth embodiment of the present invention.
Figure 8:
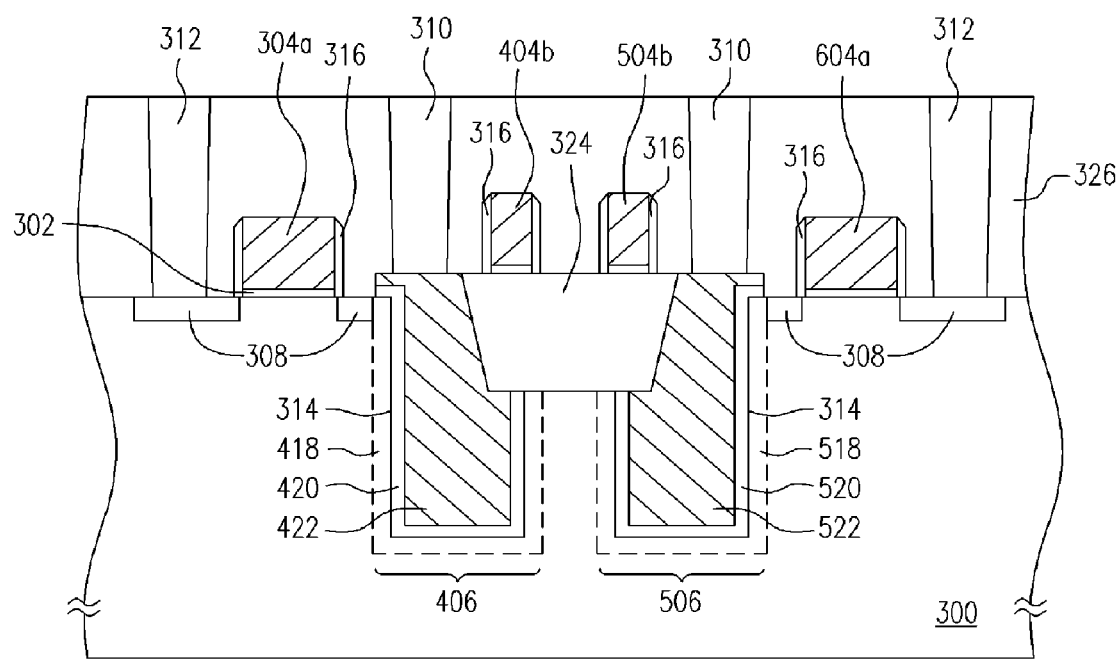
FIG. 8 is a cross-sectional view along line D-D' in FIG. 7.

FIG. 7 is a top view of a static random access memory (SRAM) unit according to a fourth embodiment of the present invention. FIG. 8 is a cross-sectional view along line D-D' in FIG. 7. As shown in FIGS. 7 and 8, the present invention also provides a static random access memory unit suitable for fabricating a memory array. The memory array comprises at least a memory cell array 10 and an adjacent memory cell array 20. The memory cell comprises a substrate 300, a gate dielectric layer 302, four conductive lines 304, 404, 504, 604, four trench capacitors 306, 406, 506, 606, source/drain regions 308, first contacts 310, second contacts 312 and a dielectric layer 326. The substrate 300 has four trenches 314 formed therein. Two of the trenches 314 are disposed in the memory cell array 10 and the other two trenches 314 are disposed in the memory cell array 20. The gate dielectric layer 302 is disposed on the substrate 300. The gate dielectric layer is fabricated using silicon oxide and formed by performing a thermal oxidation process, for example.

As shown in FIG. 7, the trench capacitor 306 and the trench capacitor 606 are disposed inside the trenches 314 of the memory cell array 20 and the trench capacitor 406 and the trench capacitor 506 are disposed inside the trenches 314 of the memory cell array 10.

As shown in FIG. 8, using the memory cell array 10 as an example, the trench capacitors 406 and 506 comprise a pair of lower electrodes 418, 518, a pair of capacitor dielectric layer 420, 520, a pair of upper electrodes 422, 522 and an isolation structure 324. The lower electrodes 418, 518 are disposed in the substrate 300 on the surface of the trenches 314. The lower electrodes 418, 518 are inversion layers, for example. The method of forming the inversion layer in the substrate 300 on the surface of the trenches 314 includes applying a voltage to the contacts 310 that are electrically connected to the trench capacitors 306, 406, 506, 606 in a subsequent operation. The capacitor dielectric layers 420, 520 are disposed on the surface of the trenches 314 and part of the substrate 300 on the upper side margin of the trenches 314. The capacitor dielectric layers 420, 520 are fabricated from high dielectric constant dielectric material. The high dielectric constant dielectric material layers are oxide/nitride/oxide composite stack layers, for example. In addition, the upper electrodes 422, 522 are disposed in the trenches 314 on the substrate 300 to cover the capacitor dielectric layers 420, 520. The upper electrodes 422, 522 are fabricated using doped polysilicon, for example. The isolation structure 324 is disposed in part of the capacitor dielectric layers 420, 520 and the upper electrodes 422, 522 and in part of the substrate 300. The isolation structure 324 is a shallow trench isolation (STI) structure, for example. Furthermore, the trench capacitors 306, 606 have a structure similar to the trench capacitors 406, 506. Since anyone familiar with the technology is able to deduce the structural form of the trench capacitors 306 and 606, a detailed description is omitted.

As shown in FIGS. 7 and 8, the conductive lines 304, 404, 504, 604 are sequentially disposed over the gate dielectric layer 302 in a direction perpendicular to the direction of extension of the memory cell array 10 and the memory cell array 20. The conductive lines 304, 404, 504, 604 are word lines, for example. The conductive line 304 is disposed on the other side of the side where the trench capacitor 406 is adjacent to the trench capacitor 506 and passing over the trench capacitor 306. The conductive line 604 is disposed on the other side of the side where the trench capacitor 506 is adjacent to the trench capacitor 406 and passing over the trench capacitor 606. The conductive line 404 and the conductive line 504 are disposed between the trench capacitor 406 and the trench capacitor 506. Furthermore, the conductive line 404 passes over the trench capacitor 406 and the conductive line 504 passes over the trench capacitor 506. The aforementioned conductive lines 304, 404, 504, 604 are fabricated using doped polysilicon and formed by performing a chemical vapor deposition process with in-situ doping, for example. In addition, spacers 316 may also be formed on the respective sides of the conductive lines 304, 404, 504 and 604. The spacers 316 are fabricated using silicon nitride, for example.

That portion of the aforementioned conductive lines 304, 404, 504, 604 located inside the memory cell array 10 includes a gate 304a, a passing gate 404b, a passing gate 504b and a gate 604a respectively. Similarly, that portion of the conductive lines 304, 404, 504, 604 located inside the memory cell array 20 includes a passing gate 304b, a gate 404a, a gate 504a and a passing gate 604b. The passing gates 304b, 404b, 504b and 604b are disposed over the trench capacitors 306, 406, 506 and 606 respectively.

The source drain regions 308 are disposed in the substrate 300 on the respective sides of the conductive line 304 (the gate 304a) and the conductive line 604 (the gate 604a) of the memory cell array 10 as well as in the substrate 300 on the respective sides of the conductive line 404 (the gate 404a) and the conductive line 504 (the gate 504a) of the memory cell array 20. The method of forming the source/drain regions 308 includes performing an ion implant process, for example. It should be noted that the source/drain region 308 on one side of the gates are electrically connected to the lower electrodes (refer to the labeled parts 418 and 518 in FIG. 8) of the trench capacitors 306, 406, 506 and 606. The source/drain regions 308 on the other side are shared between two adjacent active devices.

The dielectric layer 326 is disposed on the substrate 300 to cover the conductive lines 304, 404, 504, 604 and the trench capacitors 306, 406, 506 and 606. The dielectric layer 326 is a silicon oxide layer formed, for example, by performing a chemical vapor deposition process.

The contacts 310 are disposed in the dielectric layer 326 and electrically connected to the trench capacitors 306, 406, 506, 606. By applying a voltage to the contact 310, inversion layers serving as the lower electrodes (refer to the labeled parts 418 and 518 in FIG. 8) of the trench capacitors 306, 406, 506, 606 are formed in the substrate 300 on the surface of the trench 314. The contacts 310 are upper electrode contacts, for example. The contacts 310 are fabricated using doped polysilicon, aluminum, tungsten or copper, for example.

The contacts 312 are disposed in the dielectric layer 326 and electrically connected to the source/drain region 308 on the other side of the side where the conductive line 304 is adjacent to the trench capacitor 406, the source/drain region 308 on the other side of the side where the conductive line 604 is adjacent to the trench capacitor 506 and the source/drain region 308 between the conductive line 404 and the conductive line 504. The contacts 312 are bit-line contacts, for example. The contacts 312 are fabricated using doped polysilicon, aluminum, tungsten or copper, for example.

As shown in the fourth embodiment, the SRAM unit is a four bit memory unit. Therefore, a memory device having such a SRAM unit structure is able to increase the level of integration of memory devices.

In summary, the static random access memory unit provides an improved memory cell disposition. Thus, it does not matter if a single bit, a binary bit or a four-bit memory cell is used as the smallest memory unit in the repetitive disposition to form a memory array. Ultimately, the area occupation of the memory devices is reduced and the level of integration of the memory devices in increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A static random access memory (SRAM) unit, comprising:
   a substrate having a trench formed therein;
   a gate dielectric layer disposed on the substrate;
   a gate disposed on the gate dielectric layer;
   a trench capacitor disposed in the trench on one side of the gate;
   an isolation structure disposed in part of the trench capacitor and in part of the substrate;
   a passing gate disposed on the isolation structure;
   a source/drain region disposed in the substrate on the respective sides of the gate, wherein the source/drain region on one side of the gate is located between the gate and the trench capacitor;
   a first contact electrically connected to the trench capacitor and disposed between the passing gate and the gate; and
   a second contact electrically connected to the source/drain region on the other side of the gate.

2. The SRAM unit of claim 1, wherein the trench capacitor further comprises:
   a lower electrode disposed in the substrate on the surface of the trench;
   a capacitor dielectric layer disposed on the surface of the trench;
   an upper electrode disposed in the trench over the substrate to cover the capacitor dielectric layer; and
   the isolation structure disposed in part of the capacitor dielectric layer and the electrode and in part of the substrate.

3. The SRAM unit of claim 2, wherein part of the capacitor dielectric layer is also disposed over part of the substrate on the upper side margin of the trench.

4. The SRAM unit of claim 2, wherein the capacitor dielectric layer comprises an oxide/nitride/oxide composite stack layer.

5. The SRAM unit of claim 2, wherein the material constituting the upper electrode comprises doped polysilicon.

6. The SRAM unit of claim 2, wherein the lower electrode comprises an inversion layer.

7. The SRAM unit of claim 2, wherein the isolation structure comprises a shallow trench isolation (STI) structure.

8. The SRAM unit of claim 1, wherein the first contact comprises an upper electrode contact and the second contact comprises a bit-line contact.

* * * * *